US 11,411,398 B2

(12) United States Patent
Hauer

(10) Patent No.: US 11,411,398 B2
(45) Date of Patent: Aug. 9, 2022

(54) ARRANGEMENT, CIRCUIT BREAKER AND PRECHARGING DEVICE FOR A DC POWER NETWORK

(71) Applicant: Eaton Intelligent Power Limited, Dublin (IE)

(72) Inventor: Wolfgang Hauer, Vorderweissenbach (AT)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 17/356,590

(22) Filed: Jun. 24, 2021

(65) Prior Publication Data
US 2021/0408787 A1    Dec. 30, 2021

(30) Foreign Application Priority Data
Jun. 30, 2020    (GB) ...................................... 2009938

(51) Int. Cl.
*H02J 1/00* (2006.01)
*H03K 17/56* (2006.01)

(52) U.S. Cl.
CPC ................ *H02J 1/00* (2013.01); *H03K 17/56* (2013.01)

(58) Field of Classification Search
CPC ........ H02H 1/0007; H02H 3/08; H02H 3/087; H02H 9/001; H02H 9/002; H02J 7/0304; H02J 13/00036; H02J 7/345; H02J 1/00; H02J 13/0004; H02J 1/06; H02J 7/0024; H02J 9/061; H02J 13/00012; H02M 7/4835; H02M 3/158; H02M 1/36; H02M 7/21; H02M 3/07; H03K 19/0963; H03K 17/6874
See application file for complete search history.

(56) References Cited

U.S. PATENT DOCUMENTS

| | | | |
|---|---|---|---|
| 2005/0213357 A1 | 9/2005 | Paatero | |
| 2014/0111001 A1* | 4/2014 | Miliani | H02M 1/15 307/9.1 |
| 2015/0102691 A1* | 4/2015 | Kollreutter | H02J 7/0029 307/328 |
| 2018/0076646 A1* | 3/2018 | Lindsay | H02J 7/0068 |
| 2018/0166892 A1* | 6/2018 | Sepe, Jr. | H02J 7/007194 |

FOREIGN PATENT DOCUMENTS

| | | | |
|---|---|---|---|
| JP | 09247851 A | 9/1997 | |
| WO | WO-2015118122 A1 * | 8/2015 | ............ H02J 7/0068 |

* cited by examiner

*Primary Examiner* — John W Poos
(74) *Attorney, Agent, or Firm* — Leydig, Voit & Mayer, Ltd.

(57) ABSTRACT

An arrangement includes: a direct current power network with a plus pole and a minus pole; two series capacitors, a first outer tap being connected to the plus pole via a first power line, a second outer tap being connected to the minus pole via a second power line and a middle tap is connected to ground; a circuit switch arranged in at least one of the first and the second power line; a circuit switch control unit for opening the circuit switch upon overcurrent and/or upon manual intervention; a switchable high ohmic path in at least one of the first and the second power line, which bypasses a) a switchable low ohmic path in the least one of the first and the second power line or b) the circuit switch; and a load control unit for measuring a total voltage of the two series capacitors.

14 Claims, 7 Drawing Sheets

ARRANGEMENT, CIRCUIT BREAKER AND PRECHARGING DEVICE FOR A DC POWER NETWORK

CROSS-REFERENCE TO PRIOR APPLICATION

Priority is claimed to British Patent Application No. GB 2009938.8, filed on Jun. 30, 2020, the entire disclosure of which is hereby incorporated by reference herein.

FIELD

The invention relates to an arrangement, which comprises a direct current power network ("DC power network" for short) with a plus pole and a minus pole, two series capacitors, wherein a first outer tap is connected to the plus pole via a first power line, wherein a second outer tap is connected to the minus pole via a second power line and wherein a middle tap is connected to ground. Furthermore, the arrangement comprises a circuit switch arranged in at least one of the first and the second power line and a circuit switch control unit, which is designed to open the circuit switch in case of overcurrent and/or upon manual intervention. Moreover, the invention relates to a circuit breaker, which comprises a first breaker input terminal for connecting a plus pole of a direct current power network and a second breaker input terminal for connecting a minus pole of said direct current power network as well as a first breaker output terminal for connecting a first outer tap of two series capacitors and a second breaker output terminal for connecting a second outer tap of the two series capacitors. A first breaker current path of the circuit breaker connects the first breaker input terminal and the first breaker output terminal, and a second breaker current path of the circuit breaker connects the second breaker input terminal and the second breaker output terminal. Furthermore, the circuit breaker comprises a circuit switch arranged in at least one of the first and the second breaker current paths and a circuit switch control unit, which is designed to open the circuit switch in case of overcurrent and/or upon manual intervention. Finally, the invention relates to a precharging device, which comprises a first precharger input terminal for connecting a plus pole of a direct current power network and a second precharger input terminal for connecting a minus pole of said direct current power network as well as a first precharger output terminal for connecting a first outer tap of two series capacitors and a second precharger output terminal for connecting a second outer tap of the two series capacitors. Furthermore, the precharging device comprises a first precharger current path connecting the first precharger input terminal and the first precharger output terminal and a second precharger current path connecting the second precharger input terminal and the second precharger output terminal.

BACKGROUND

An arrangement, a circuit breaker and a precharging circuit of the kind disclosed hereinbefore is known in principle. The capacitors are used as energy buffers what may cause problems in transition phases between different operating states. In particular, an overcurrent condition in the circuit breaker can be caused, which in turn leads to disconnection from the DC power network. In addition, in prior art, solutions for (floating) DC power networks are missing and more generally solutions, which cover all necessary aspects of connecting capacitors to a DC power network via a circuit breaker.

SUMMARY

In an embodiment, the present invention provides an arrangement, comprising: a direct current power network with a plus pole and a minus pole; two series capacitors, a first outer tap being connected to the plus pole via a first power line, a second outer tap being connected to the minus pole via a second power line and a middle tap is connected to ground; a circuit switch arranged in at least one of the first and the second power line; a circuit switch control unit configured to open the circuit switch upon overcurrent and/or upon manual intervention; a switchable high ohmic path in at least one of the first and the second power line, which bypasses a) a switchable low ohmic path in the least one of the first and the second power line or b) the circuit switch; a load control unit configured to measure a total voltage of the two series capacitors as a measured total voltage and to switch on the high ohmic path and to switch off the low ohmic path in case a) or to switch on the high ohmic path and to switch off the circuit switch in case b) if the measured total voltage is below a first threshold voltage, and to switch on the low ohmic path in case a) or to switch on the circuit switch in case b) if the measured total voltage is equal or above the first threshold voltage or above a higher second threshold voltage, the first threshold voltage and the second threshold voltage being set below a voltage of the direct current power network between the plus pole and minus pole; and a balance control unit configured to measure a capacitor voltage of each of the two series capacitors and detect an imbalance of the capacitor voltages and to individually control currents through the two series capacitors by first current influencing means, a current through a first capacitor of the two series capacitors being higher than a current through a second capacitor of the two series capacitors if the first capacitor voltage of the first capacitor is lower than the second capacitor voltage of the second capacitor and vice versa.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
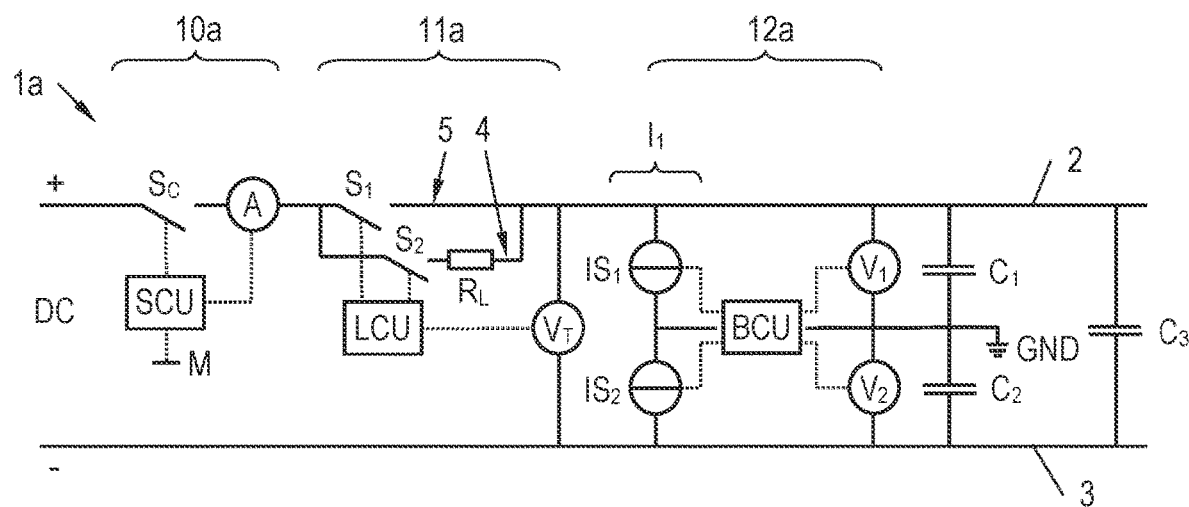
FIG. 1 shows a circuit diagram of an arrangement with a circuit switch control circuit, a load control circuit and a balance control circuit.

In an embodiment, the present invention provides an improved arrangement, an improved circuit breaker and an improved precharging circuit. In particular, a solution is provided, which covers all necessary aspects of connecting capacitors to a DC power network via a circuit breaker, more particularly for floating DC power networks, where neither the plus pole nor the minus pole has a direct connection to ground.

In an embodiment, the present invention provides an arrangement as disclosed in the opening paragraph, which additionally comprises a switchable high ohmic path in at least one of the first and the second power line, which bypasses a) a switchable low ohmic path in the least one of the first and the second power line or b) the circuit switch, a load control unit, which is designed to measure the total voltage of the two series capacitors and to switch on the high ohmic path and to switch off the low ohmic path in case a) or to switch on the high ohmic path and to switch off the circuit switch in case b) if the measured total voltage is below a first threshold voltage and to switch on the low ohmic path (and in particular also to switch off the high ohmic path) in case a) or to switch on the circuit switch (and in particular also to switch off the high ohmic path) in case b) if the measured total voltage is equal or above the first threshold voltage or above a second higher threshold voltage, wherein the first threshold voltage and, if existent, the second threshold voltage are set below a voltage of the direct current power network between its plus pole and minus pole and a balance control unit, which is designed to measure a capacitor voltage of each of the two series capacitors, to detect an imbalance of these capacitor voltages and to individually control currents through the two series capacitors by use of first current influencing means, wherein a current through a first capacitor of the two series capacitors is higher than a current through a second capacitor of the two series capacitors if the first capacitor voltage of the first capacitor is lower than the second capacitor voltage of the second capacitor and vice versa.

In an embodiment, the present invention provides a circuit breaker as disclosed in the opening paragraph, which additionally comprises a switchable high ohmic path in at least one of the first and the second breaker current paths, which bypasses a) a switchable low ohmic path in the least one of the first and the second breaker current paths or b) the circuit switch, a load control unit, which is designed to measure the total voltage between the first breaker output terminal and the second breaker output terminal and to switch on the high ohmic path and to switch off the low ohmic path in case a) or to switch on the high ohmic path and to switch off the circuit switch in case b) if the measured total voltage is below a first threshold voltage and to switch on the low ohmic path (and in particular to switch off the high ohmic path) in case a) or to switch on the circuit switch (and in particular to switch off the high ohmic path) in case b) if the measured total voltage is equal or above the first threshold voltage or above a second higher threshold voltage, wherein the first threshold voltage and, if existent, the second threshold voltage are set below a nominal voltage which may be applied to the first breaker input terminal and the second breaker input terminal and/or a third breaker output terminal for connecting a middle tap of the two series capacitors as well as a balance control unit, which is designed to measure a first voltage between the first breaker output terminal and the third breaker output terminal and a second voltage between the third breaker output terminal and the second breaker output terminal, to detect an imbalance of the first and the second voltage and to individually control currents through the first breaker output terminal and the second breaker output terminal, wherein a current through the first breaker output terminal is higher than a current through the second breaker output terminal if the first voltage is lower than the second voltage and vice versa.

In an embodiment, the present invention provides a precharging device as disclosed in the opening paragraph, which additionally comprises a switchable high ohmic path in at least one of the first and the second precharger current paths, which bypasses a switchable low ohmic path in the least one of the first and the second precharger current paths as well as a load control unit, which is designed to measure the total voltage between the first precharger output terminal and the second precharger output terminal and to switch on the high ohmic path and to switch off the low ohmic path if the measured total voltage is below a first threshold voltage and to switch on the low ohmic path (and in particular to switch off the high ohmic path) if the measured total voltage is equal or above the first threshold voltage or above a second higher threshold voltage, wherein the first threshold voltage and, if existent, the second threshold voltage are set below a nominal voltage which may be applied to the first precharger input terminal and the second precharger input terminal and/or a third breaker output terminal for connecting a middle tap of the two series capacitors as well as a balance control unit, which is designed to measure a first voltage between the first precharger output terminal and the third precharger output terminal and a second voltage between the third precharger output terminal and the second precharger output terminal, to detect an imbalance of the first and the second voltage and to individually control currents through the first precharger output terminal and the second precharger output terminal, wherein a current through the first precharger output terminal is higher than a current through the second precharger output terminal if the first voltage is lower than the second voltage and vice versa.

By the above measures, any load current loading the capacitors is limited and any imbalance of the capacitor voltages is avoided or at least reduced. Accordingly, an overcurrent condition in the circuit breaker is avoided, and the circuit switch is not triggered by the load current for the capacitors. In addition, the voltage of the DC power network is symmetric around ground. Hence, the voltage of the DC power network does not float arbitrarily.

"Ground" in the context of the invention can mean a common reference potential for a plurality of DC power networks and/or an earth potential of a single DC power network or a plurality of DC power networks.

Beneficially, the switchable high ohmic path comprises a switch and a serial resistor or second current influencing means which allow more than two control values within a current range (with or without a switch and in particular with a current range starting at zero). Accordingly, the resistance of the high ohmic path can be switched or changed between two values (on/off) or a plurality of values.

It should be noted in this context that "switchable" in view of the low ohmic path usually means switchable between two values (on/off). A switch in the low ohmic path for example can be embodied as an electronic switch (e.g. by use of transistors) or as an electromechanical switch (e.g. as a relay). "Switchable" in view of the high ohmic path can mean the same or for example a current source, the current range of which in particular (but not necessarily) starts at zero or almost at zero. "Almost zero" in this context in particular means 10% of a current range. Even if the high ohmic path comprises a current source, there may be an additional switch connected in series.

In a beneficial embodiment of the arrangement, the first current influencing means comprise first sub current influencing means switched in parallel with the first capacitor and second sub current influencing means switched in parallel with the second capacitor. Accordingly, in a beneficial embodiment of the circuit breaker, the first current influencing means comprise first sub current influencing means switched between the first breaker output terminal and the third breaker output terminal and second sub current influencing means switched between the third breaker output terminal and the second breaker output terminal. Accordingly, in a beneficial embodiment of the precharging device, the first current influencing means comprise first sub current influencing means switched between the first precharger output terminal and the third precharger output terminal and second sub current influencing means switched between the third precharger output terminal and the second precharger output terminal. In this way, currents through the capacitors can be controlled independently from each other.

In a further beneficial embodiment of the arrangement, the first current influencing means comprise first sub current influencing means and second sub current influencing, wherein the first sub current influencing means are arranged in a first switchable high ohmic path in the first power line, which bypasses a) a first switchable low ohmic path in the first power line or b) the circuit switch in the first power line and wherein the second sub current influencing means are arranged in a second switchable high ohmic path in the second power line, which bypasses a second switchable low ohmic path in the second power line in case a) or a complementary circuit switch in the second power line in case b). Accordingly, in a beneficial embodiment of the circuit breaker, the first current influencing means comprise first sub current influencing means and second sub current influencing, wherein the first sub current influencing means are arranged in a first switchable high ohmic path in the first breaker current path, which bypasses a) a first switchable low ohmic path in the first breaker current path or b) the circuit switch in the first breaker current path and wherein the second sub current influencing means are arranged in a second switchable high ohmic path in the second breaker current path, which bypasses a second switchable low ohmic path in the second breaker current path in case a) or a complementary circuit switch in the second breaker current path in case b). Accordingly, in a beneficial embodiment of the precharging device, the first current influencing means comprise first sub current influencing means and second sub current influencing, wherein the first sub current influencing means are arranged in a first switchable high ohmic path in the first precharger current path, which bypasses a first switchable low ohmic path in the first precharger current path and wherein the second sub current influencing means are arranged in a second switchable high ohmic path in the second precharger current path, which bypasses a second switchable low ohmic path in the second precharger current path. This is another approach to control currents through the capacitors independently from each other.

In a further beneficial embodiment of the arrangement, the load control unit is designed to keep a current through the two series capacitors below a current limit by means of the first current influencing means or by use of second current influencing means, which are arranged in the high ohmic path. Accordingly, In a beneficial embodiment of the circuit breaker, the load control unit is designed to keep a current through the first breaker output terminal and the second breaker output terminal below a current limit by means of the first current influencing means or by use of second current influencing means, which are arranged in the high ohmic path. Accordingly, In a beneficial embodiment of the precharging device, the load control unit is designed to keep a current through the first precharger output terminal and the second precharger output terminal below a current limit by means of the first current influencing means or by use of second current influencing means, which are arranged in the high ohmic path. In this way, the current through the capacitors and thus through the circuit switch is controlled and an overcurrent condition in the circuit breaker can be avoided. For example, the capacitors can be loaded with constant current. However, other current profiles are possible as well.

Beneficially, the arrangement comprises a discharge control unit, which is designed to control a discharge of the two series capacitors through a controlled current through the first current influencing means or through third current influencing means switched in parallel with the two series capacitors in case a) when the circuit switch is opened, when the high ohmic path and the low ohmic path are switched off, when a current trough the circuit switch is zero or when a current trough the high ohmic path and the low ohmic path is zero and in case b) when the circuit switch is opened and the high ohmic path is switched off or when a current trough the circuit switch and the high ohmic path is zero.

Accordingly, the circuit breaker beneficially comprises a discharge control unit, which is designed to control a discharge over the first breaker output terminal and the second breaker output terminal through a controlled current through the first current influencing means or through third current influencing means switched between the first breaker output terminal and the second breaker output terminal in case a) when the circuit switch is opened, when the high ohmic path and the low ohmic path are switched off, when a current trough the circuit switch is zero or when a current trough the high ohmic path and the low ohmic path is zero and in case b) when the circuit switch is opened and the high ohmic path is switched off or when a current trough the circuit switch and the high ohmic path is zero.

Accordingly, the precharging device beneficially comprises a discharge control unit, which is designed to control a discharge over the first precharger output terminal and the second precharger output terminal through a controlled current through the first current influencing means or through third current influencing means switched between the first precharger output terminal and the second precharger output terminal in case a) when the circuit switch is opened, when the high ohmic path and the low ohmic path are switched off, when a current trough the circuit switch is zero or when a current trough the high ohmic path and the low ohmic path is zero and in case b) when the circuit switch is opened and the high ohmic path is switched off or when a current trough the circuit switch and the high ohmic path is zero.

Generally, the capacitors get not only disconnected from the DC power network when the aforementioned switches and current paths open, but also a current drop to zero may be an indication for such a disconnection. For example, such a current drop can be caused by an opening upstream circuit breaker or if the connection to the direct current power network is disrupted in another way, e.g. by cable break.

Beneficially, the first sub current influencing means and the second sub current influencing each can be embodied as a buck converter, as electronic smoothing inductance. Such means are generally available and provide for a reliable function of the arrangement, the circuit breaker and the precharging device.

Beneficially, the arrangement, the circuit breaker or the precharging device can comprise a combined balance and discharge control unit, which performs the functions of the balance control unit and the discharge control unit. Beneficially, the arrangement, the circuit breaker or the precharging device can comprise a combined balance and load control unit, which performs the functions of the balance control unit and the load control unit. It is also beneficial if the arrangement or the circuit breaker comprises combined circuit switch and load control unit, which performs the functions of the circuit switch control unit and the load control unit. Moreover, it is beneficial if the arrangement or the circuit breaker comprises a combined circuit switch balance and load control unit, which performs the functions of the circuit switch control unit, the balance control unit and the load control unit. Moreover, it is beneficial if the arrangement or the circuit breaker comprises a combined circuit switch balance load and discharge control unit, which performs the functions of the circuit switch control unit, the balance control unit, the load control unit and the discharge control unit. All these embodiments provide highly integrated solutions for connecting capacitors to a DC power network via a circuit breaker, in particular for floating DC power networks It is of advantage if the circuit breaker is connected to the precharging device by means of a communication channel between a circuit breaker control interface of the circuit breaker and a precharger control interface of the precharging device, wherein the communication channel is prepared to exchange information about the status of the circuit switch and/or the high ohmic path and/or the low ohmic path. Accordingly, it is advantageous if the circuit breaker comprises a circuit breaker control interface, which is designed to be connected to a precharger control interface of the precharging device and which is designed to exchange information about the status of the circuit switch and/or the high ohmic path and/or the low ohmic path. Accordingly, it is also advantageous if the precharging device comprises a precharger control interface, which is designed to be connected to a circuit breaker control interface of the circuit breaker and which is designed to exchange information about the status of the circuit switch and/or the high ohmic path and/or the low ohmic path. In this way, the various control units can consider states of the circuit switch and/or the high ohmic path and/or the low ohmic path even if this circuit switch and/or this high ohmic path and/or this low ohmic path is not part of the control unit in question. For example, if the high ohmic path and the low ohmic path are not part of the circuit breaker but of another device (e.g. the precharging device) there may be a data communication between the circuit breaker and this device so as to obtain information about the status of the high ohmic path and the low ohmic path (e.g. its switching state or its current). The same is true the other way around. For example, a discharge control unit in the precharging device can consider the switching state of the circuit switch in the circuit breaker by means of said communication channel. The communication channel and the control interfaces may be wired or wireless ones.

Generally, same parts or similar parts are denoted with the same/similar names and reference signs. The features disclosed in the description apply to parts with the same/similar names respectively reference signs. Indicating the orientation and relative position (up, down, sideward, etc) is related to the associated figure, and indication of the orientation and/or relative position has to be amended in different figures accordingly as the case may be.

FIG. 1 shows a first example of an arrangement $1a$. The arrangement $1a$ comprises a direct current power network DC ("DC power network" for short) with a plus pole+ and a minus pole– and two series capacitors $C_1$, $C_2$, wherein a first outer tap is connected to the plus pole+ via a first power line 2, a second outer tap is connected to the minus pole– via a second power line 3 and a middle tap is connected to ground GND. In addition, the arrangement $1a$ comprises an optional third capacitor $C_3$ between the first power line 2 and the second power line 3.

Furthermore, the arrangement $1a$ comprises a circuit switch $S_C$ arranged in the first power line 2 and a circuit switch control unit SCU, which is designed to open the circuit switch $S_C$ in case of overcurrent and/or upon manual intervention. The overcurrent detection is symbolized by an amperemeter A, which is designed to measure the current through the circuit switch $S_C$ and whose output is fed into the switch control unit SCU. The manual intervention is symbolized with the manual push button M. It should be noted that the amperemeter A in fact can be a gauge connected to an electronic switch control unit SCU, but rather often current detection and triggering of the circuit switch $S_C$ is done by electrodynamic actuators and/or thermo sensitive actuators. In the context of this disclosure, inter alia such electrodynamic actuators and/or thermo sensitive actuators are meant with the combination of the amperemeter A and the switch control unit SCU. It should also be noted that the circuit switch $S_C$ equally can be arranged in the second power line 3, or even both the first and the second power line 2, 3 can be equipped with a circuit switch $S_C$ or in detail switching contacts of a circuit switch $S_C$. The circuit switch $S_C$, the amperemeter A and the circuit switch control unit SCU together form or are comprised of a circuit switch control circuit 10a.

Further on, the arrangement 1a comprises a switchable high ohmic path 4 in the first power line 2 which bypasses a switchable low ohmic path 5 in the first power line 2 (case a). The switchable low ohmic path 5 can be switched on and off by means of a first switch $S_1$, and the switchable high ohmic path 4 can be switched on and off by means of the second switch $S_2$. In addition, the arrangement 1a comprises a load control unit LCU, which is designed to measure the total voltage $V_T$ of the two series capacitors $C_1$, $C_2$ and to switch on the high ohmic path 4 and to switch off the low ohmic path 5 if the measured total voltage $V_T$ is below a first threshold voltage and to switch on the low ohmic path 5 (and in particular also to switch off the high ohmic path 4) in if the measured total voltage $V_T$ is equal or above the first threshold voltage or above a second higher threshold voltage. The first threshold voltage and, if existent, the second threshold voltage are set below a voltage of the direct current power network DC between its plus pole+ and minus pole−. In FIG. 1, the high ohmic path 4 is switched in parallel to a dedicated switchable low ohmic path 5 (case a). However, the high ohmic path 4 may also switched in parallel to the circuit switch $S_C$ (case b—see also FIG. 4 for example). Further on, a load resistor $R_L$ is arranged in the high ohmic path 4 in this example, but the current may also limited by other means (see FIG. 2 for example). Moreover, the switchable high ohmic path 4 and the switchable low ohmic path 5 may be arranged in the second power line 3. The switchable high ohmic path 4, the switchable low ohmic path 5, the load control unit LCU and the voltmeter for measuring the total voltage $V_T$ form or are comprised of a load control circuit 11a.

Finally, the arrangement 1a comprises a balance control unit BCU, which is designed to measure a capacitor voltage $V_1$, $V_2$ of each of the two series capacitors $C_1$, $C_2$, to detect an imbalance of these capacitor voltages $V_1$, $V_2$ and to individually control currents through the two series capacitors $C_1$, $C_2$ by use of first current influencing means $I_1$, wherein a current through the first capacitor $C_1$ is higher than a current through the second capacitor $C_2$ if the first capacitor voltage $V_1$ of the first capacitor $C_1$ is lower than the second capacitor voltage $V_2$ of the second capacitor $C_2$ and vice versa. In this example, the first current influencing means $I_1$ comprise first sub current influencing means $IS_1$ switched in parallel with the first capacitor $C_1$ and second sub current influencing means $IS_2$ switched in parallel with the second capacitor $C_2$. The first sub current influencing means $IS_1$ and the second sub current influencing means $IS_2$ for example may be embodied as controllable current sources. The first current influencing means $I_1$, the balance control unit BCU and the voltmeters for measuring the capacitor voltages $V_1$, $V_2$ form or are comprised of a balance control circuit 12a.

The function of the arrangement 1a is as follows:

As long as the measured total voltage $V_T$ is below the first threshold voltage, the high ohmic path 4 is switched on and the low ohmic path 5 is switched off by the load control unit LCU. Accordingly, any load current loading the capacitors $C_1$, $C_2$ is limited by the load resistor $R_L$. In addition, the balance control unit BCU takes care that both capacitors $C_1$, $C_2$ are loaded equally so that the voltage of the direct current power network DC is symmetric around ground GND. If the capacitors $C_1$, $C_2$ are sufficiently loaded, what means that the total voltage $V_T$ is equal or above the first threshold voltage or above a second higher threshold voltage, the low ohmic path 5 is switched on by the load control unit LCU. Additionally, the high ohmic path 6 can be switched off by the load control unit LCU. Accordingly, any load (not depicted in FIG. 1) is connected with the direct current power network DC directly via the low ohmic path 5 in this state. By these measures, an overcurrent condition in the circuit switch control circuit 10a is avoided, and the circuit switch $S_C$ is not triggered by the load current for the capacitors $C_1$, $C_2$.

Figure 2:
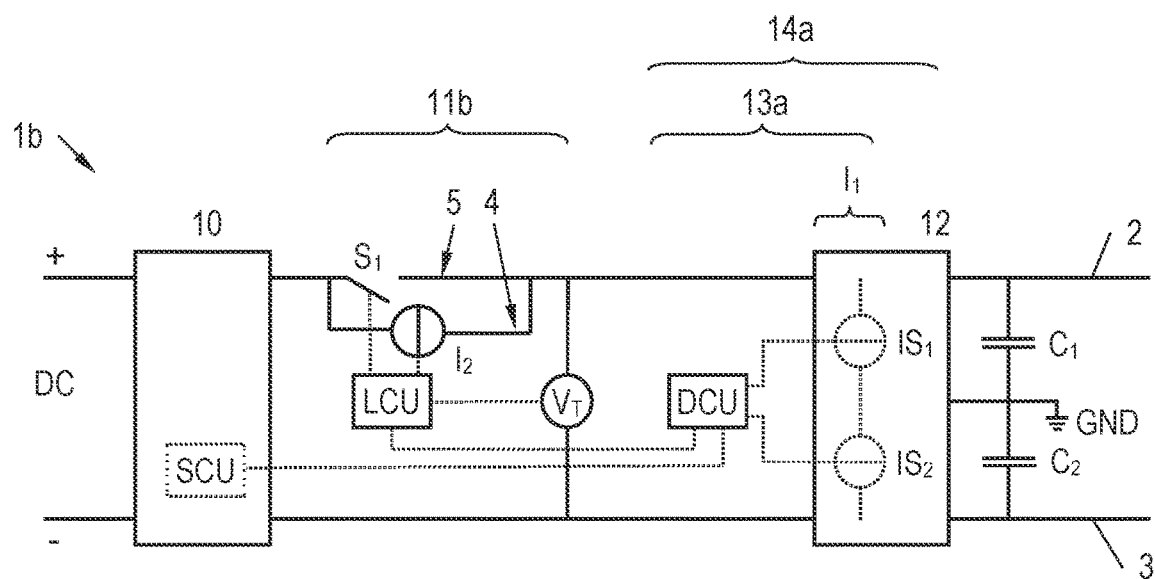
FIG. 2 shows a circuit diagram of an arrangement with a current source in the high ohmic path and a discharge control circuit.

In the example of FIG. 1, the current through the two series capacitors $C_1$, $C_2$ is limited by the load resistor $R_L$, but this is not the only possibility as the arrangement 1b of FIG. 2 shows. Instead, the load control unit LCU can be designed to keep a current through the two series capacitors $C_1$, $C_2$ below a current limit by use of second current influencing means $I_2$, which are arranged in the high ohmic path 4. The second current influencing means $I_2$ may be embodied as a controllable current source. For example, the current can be kept constant, but other current profiles are applicable as well. It should be noted that the second current influencing means $I_2$ have a current range starting at zero or almost at zero here so that the second switch $S_2$ can be omitted. However, the high ohmic path 4 can comprise an additional second switch $S_2$ controlled by the load control unit LCU as the case may be (see also FIG. 4). The switchable high ohmic path 4, the switchable low ohmic path 5, the load control unit LCU and the voltmeter for measuring the total voltage $V_T$ form or are comprised of a second example of a load control circuit 11b.

Moreover, the arrangement 1b comprises an optional discharge control unit DCU, which is designed to control a discharge of the two series capacitors $C_1$, $C_2$ through a controlled current through the first current influencing means $I_1$ when the circuit switch $S_C$ is opened or when both the high ohmic path 4 and the low ohmic path 5 are switched off. Alternatively or in addition, the discharge control unit DCU can be designed to control a discharge of the two series capacitors $C_1$, $C_2$ when a current trough the circuit switch $S_C$ is zero or when a current trough the high ohmic path 4 and the low ohmic path 5 is zero. In this way, also other causes for a disconnection to the direct current power network DC can be detected. For example, an upstream circuit breaker can open the connection to the direct current power network DC, or the connection can be disrupted in another way, e.g. because of cable break. By the above measures, the capacitors $C_1$, $C_2$ are automatically discharged when the connection to the direct current power network DC is interrupted. Accordingly, no danger arises from loaded capacitors $C_1$, $C_2$ when the power lines 2, 3 are thought to be switched off. To obtain the switching status of the circuit switch $S_C$, the discharge control unit DCU is connected with the circuit switch control unit SCU, and to obtain the status of the high ohmic path 4 and the low ohmic path 5, the discharge control unit DCU is connected with the load control unit LCU. Signals between the discharge control unit DCU and the circuit switch control unit SCU or the load control unit LCU can be sent by wire or wirelessly. The first current influencing means $I_1$ and the discharge control unit DCU form or are comprised of a discharge control circuit 13a. Moreover, the balance control circuit 12 and the discharge control circuit 13a can form a combined balance and discharge control circuit 14a. If the switchable high ohmic path 4 bypasses the circuit switch $S_C$ (case b), the discharge control unit DCU can be designed to control a discharge of the two series capacitors $C_1$, $C_2$ when the circuit switch $S_C$ is opened and the high ohmic path 4 is switched off or when a current trough the circuit switch $S_C$ and the high ohmic path 4 is zero (see also FIG. 4).

Figure 3:
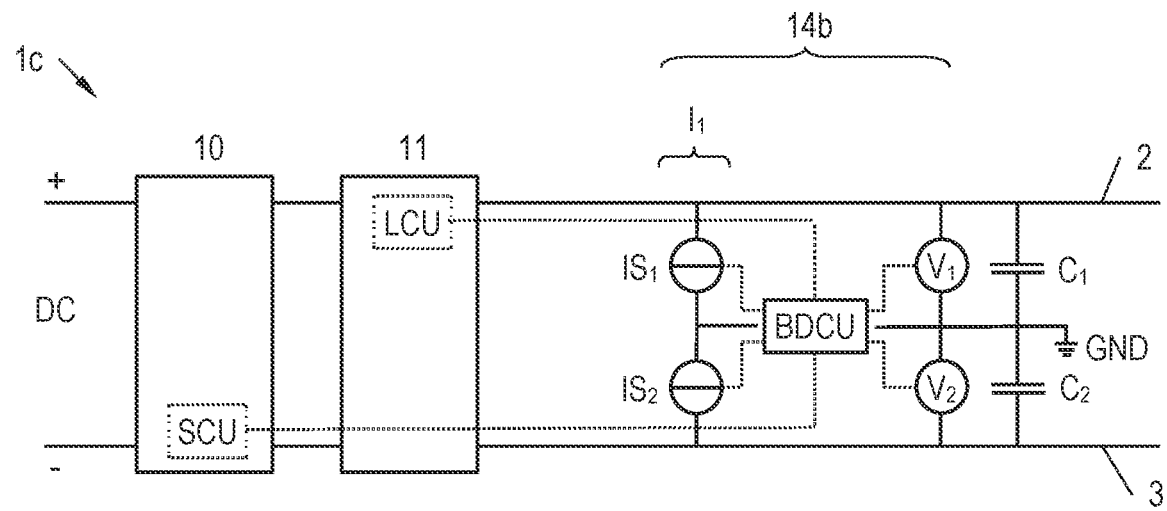
FIG. 3 shows a circuit diagram of an arrangement with a combined balance and discharge control circuit.

FIG. 3 shows an example of an arrangement 1c with a combined balance and discharge control unit BDCU, which performs the functions of the balance control unit BCU and the discharge control unit DCU, wherein the first current influencing means $I_1$ comprise first sub current influencing means $IS_1$ switched in parallel with the first capacitor $C_1$ and second sub current influencing means $IS_2$ switched in parallel with the second capacitor $C_2$. The first current influencing means $I_1$, the combined balance and discharge control unit BDCU and the voltmeters for measuring the capacitor voltages $V_1$, $V_2$ form or are comprised of a combined balance and discharge control circuit 14b.

Figure 4:
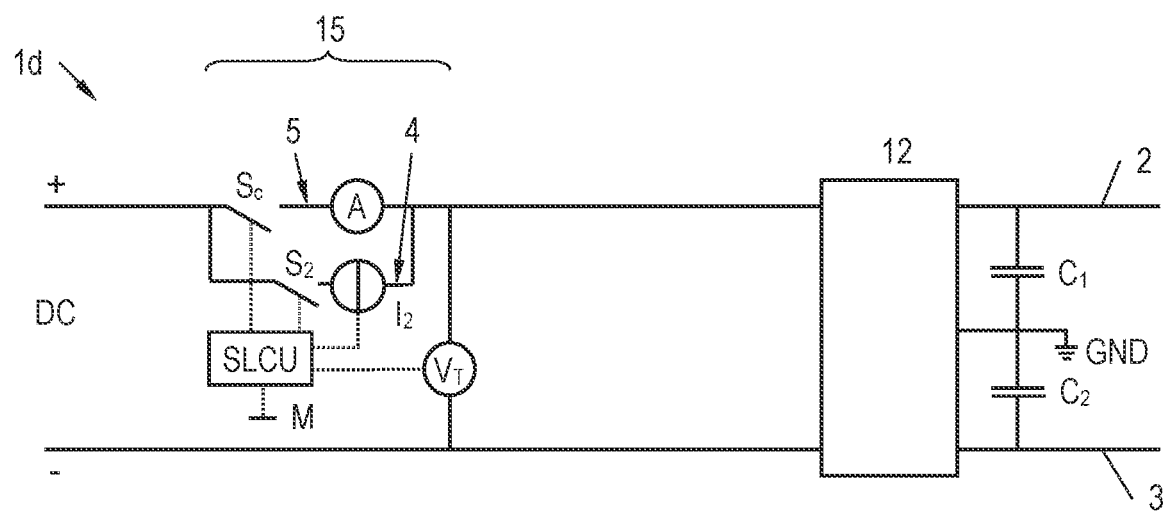
FIG. 4 shows a circuit diagram of an arrangement where the high ohmic path and its second switch are switched in parallel to the circuit switch.

FIG. 4 shows an example of an arrangement 1d, where the high ohmic path 4 and its second switch $S_2$ are switched in parallel to the circuit switch $S_C$, which is arranged in the low ohmic path 5 here (case b). In this example, there is a combined circuit switch and load control unit SLCU, which performs the functions of the circuit switch control unit SCU and the load control unit LCU. However, the circuit switch control unit SCU and the load control unit LCU may also be embodied as separate units as the case may be. The combined circuit switch and load control unit SLCU (or a separate load control unit LCU) in this example is designed to switch on the high ohmic path 4 and to switch off the circuit switch $S_C$ if the measured total voltage $V_T$ is below a first threshold voltage and to switch on the circuit switch $S_C$ (and in particular to switch off the high ohmic path 4) if the measured total voltage $V_T$ is equal or above the first threshold voltage or above a second higher threshold voltage. The high ohmic path 4, the low ohmic path 5, the combined circuit switch and load control unit SLCU and the voltmeter for measuring the total voltage $V_T$ form or are comprised of a combined circuit switch and load control circuit 15.

Figure 5:
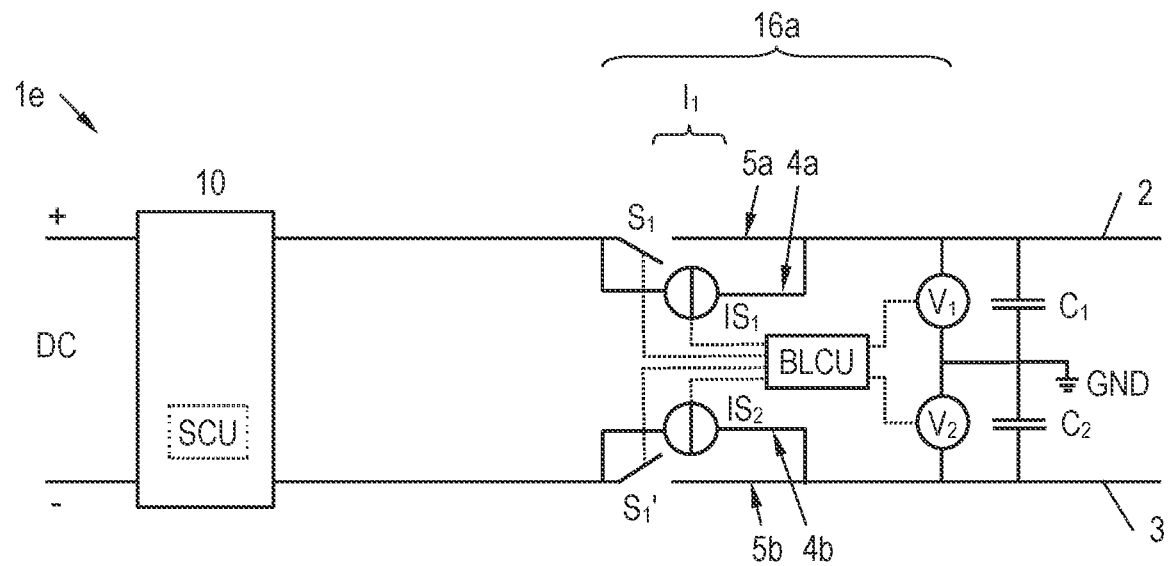
FIG. 5 shows a circuit diagram of an arrangement with sub current influencing means in the power lines.

FIG. 5 shows an arrangement 1e with first current influencing means $I_1$, which again comprise first sub current influencing means $IS_1$ and second sub current influencing means $IS_2$, but where the first sub current influencing means $IS_1$ and second sub current influencing means $IS_2$ are arranged differently to the embodiments shown in FIGS. 1 to 4. In detail, the first sub current influencing means $IS_1$ are arranged in a first switchable high ohmic path 4a in the first power line 2, which bypasses a first switchable low ohmic path 5a in the first power line 2, and the second sub current influencing means $IS_2$ are arranged in a second switchable high ohmic path 4b in the second power line 3, which bypasses a second switchable low ohmic path 5b in the second power line 3 (case a). So, the first sub current influencing means $IS_1$ and the second sub current influencing means $IS_2$ are not switched in parallel with the capacitors $C_1$, $C_2$, but are switched in the power lines 2, 3. The first switchable low ohmic path 5a can be switched on and off by means of a first switch $S_1$, and the second switchable low ohmic path 5b can be switched on and off by means of a complementary first switch $S_1'$. It should also be noted, that the first switch $S_1$ and the complementary first switch $S_1'$ can also be switching contacts of a single switching device, which are moved simultaneously.

Again, a load control unit LCU can designed to keep a current through the two series capacitors $C_1$, $C_2$ below a current limit by use of the first current influencing means $I_1$. However, in the example of FIG. 5 there is a combined balance and load control unit BLCU, which performs the functions of the balance control unit BCU and the load control unit LCU. That means, any current loading the capacitors $C_1$, $C_2$ is limited by the load control function, and any imbalance of capacitor voltages $V_1$, $V_2$ is avoided or limited by the balance control function. For this reason the combined balance and load control unit BLCU is connected to the voltmeters for measuring the capacitor voltages $V_1$, $V_2$ of each of the two series capacitors $C_1$, $C_2$ which also provide the total voltage $V_T$ as the sum of $V_1+V_2$. Further on, the combined balance and load control unit BLCU is connected to the first switch $S_1$, to the complementary first switch $S_1'$ and to the first current influencing means $I_1$. The combined balance and load control unit BLCU, the voltmeters for measuring the capacitor voltages $V_1$, $V_2$, the first switch $S_1$, the complementary first switch $S_1'$ and the first current influencing means $I_1$ form or are comprised of a combined balance and load control circuit 16a.

In the example shown in FIG. 5, the first sub current influencing means $IS_1$ and the second sub current influencing means $IS_2$ are switched in parallel with the first switch $S_1$ and the complementary first switch $S_1'$. However, this is no necessary condition, and in an alternative embodiment the first sub current influencing means $IS_1$ can be switched in parallel with the circuit switch $S_C$, and the second sub current influencing means $IS_2$ can switched in parallel with a complementary circuit switch $S_C$ (case b—see also FIG. 9 for example).

It should also be noted that the first sub current influencing means $IS_1$ and the second sub current influencing means $IS_2$ have a current range starting at zero or almost at zero here so that a second switch $S_2$ and a complementary second switch $S_2'$ can be omitted. However, the high ohmic paths 4a, 4b can comprise additional second switches $S_2$, $S_2'$ controlled by the load control unit LCU or the combined balance and load control unit BLCU as the case may be (see also FIG. 4).

Figure 6:
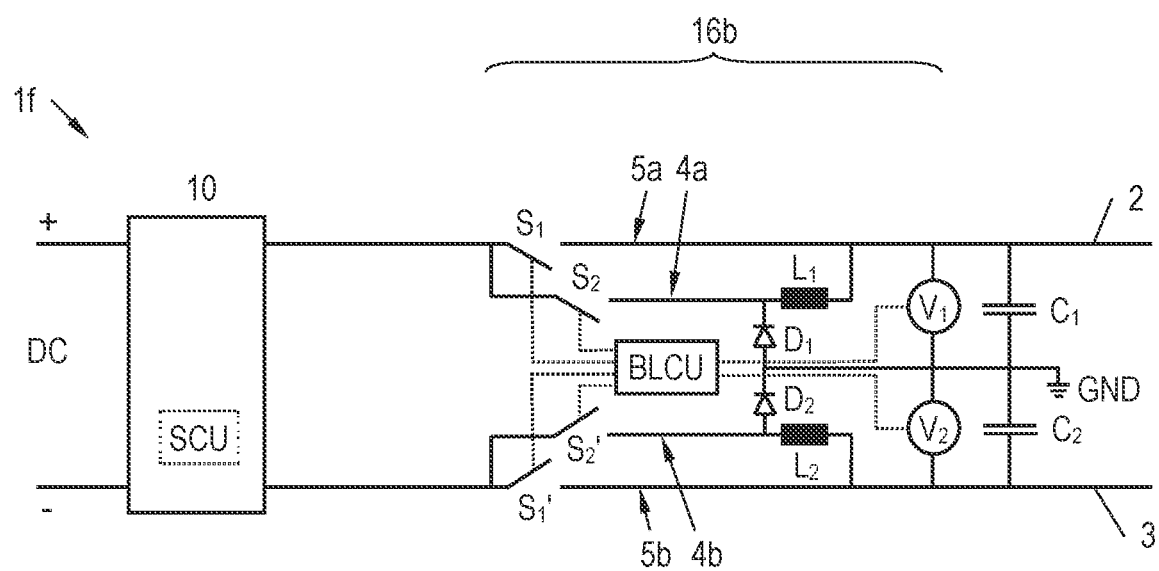
FIG. 6 shows a circuit diagram of an arrangement where the sub current influencing means are embodied as buck converters.

FIG. 6 shows an arrangement 1f, in which the first sub current influencing means $IS_1$ and the second sub current influencing means $IS_2$ each are embodied as a buck converter. In detail, the first sub current influencing means $IS_1$ comprise a second switch $S_2$, a first inductance $L_1$ and a first diode $D_1$, and the second sub current influencing means $IS_2$ comprise a complementary second switch $S_2'$, a second inductance $L_2$ and a second diode $D_2$. wherein the second switches $S_2$, $S_2'$ are controlled by the combined balance and load control unit BLCU (or by a separate load control unit LCU and balance control unit BCU as the case may be). The currents through the first sub current influencing means $IS_1$ and the second sub current influencing means $IS_2$ for example can be controlled by the pulse-pause-ratio of the second switches $S_2$, $S_2'$. The combined balance and load control unit BLCU, the voltmeters for measuring the capacitor voltages $V_1$, $V_2$, the first switches $S_1$, $S_1'$, the second switches $S_2$, $S_2'$, the inductances $L_1$, $L_2$ and the diodes $D_1$, $D_2$ form or are comprised of a combined balance and load control circuit 16b.

Figure 7:
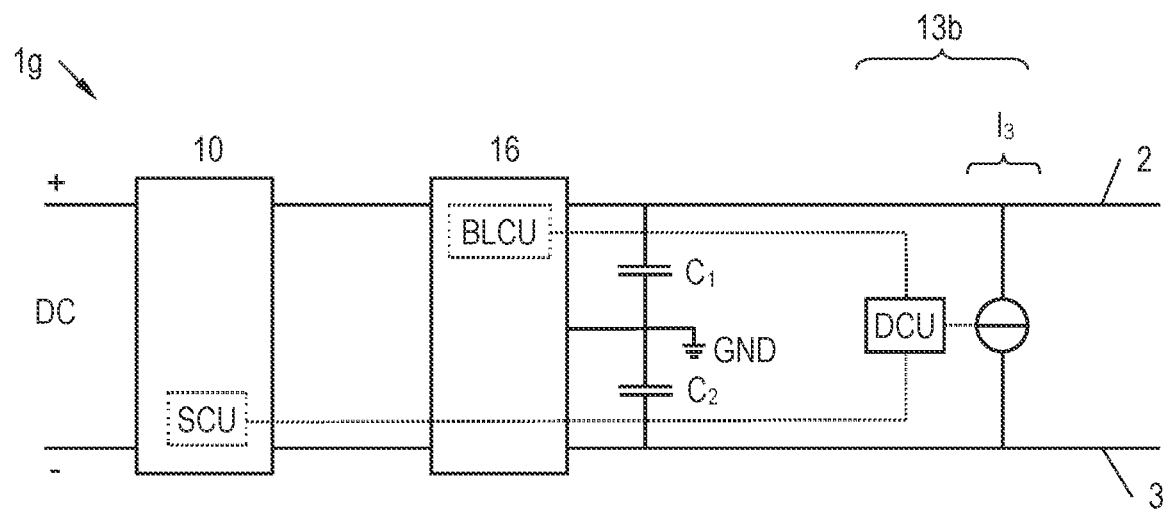
FIG. 7 shows a circuit diagram of an arrangement with third current influencing means and a discharge control unit for discharging the capacitors.

FIG. 7 shows an arrangement 1g with a discharge control unit DCU, which is designed to control a discharge of the two series capacitors $C_1$, $C_2$ through a controlled current through third current influencing means $I_3$ switched in parallel with the first capacitor $C_1$ and the second capacitor $C_2$ when at least one of the circuit switches $S_C$, $S_C'$ is opened or when both the high ohmic paths 4a, 4b and the low ohmic paths 5a, 5b are switched off. Alternatively or in addition, the discharge control unit DCU can be designed to control a discharge of the two series capacitors $C_1$, $C_2$ when a current trough the circuit switch $S_C$ is zero or when a current trough the high ohmic path 4 and the low ohmic path 5 is zero. In this way, also other causes for a disconnection to the direct current power network DC can be detected. For example, an upstream circuit breaker can open the connection to the direct current power network DC, or the connection can be disrupted in another way, e.g. because of cable break. By these measures, the capacitors $C_1$, $C_2$ are automatically discharged when the connection to the direct current power network DC is interrupted. Accordingly, no danger arises from loaded capacitors $C_1$, $C_2$ when the power lines 2, 3 are thought to be switched off. To obtain the switching status of the circuit switch $S_C$, the discharge control unit DCU is connected with the circuit switch control unit SCU, and to obtain the status of the high ohmic paths 4a, 4b and the low ohmic path 5a, 5b, the discharge control unit DCU is connected with the combined balance and load control unit BLCU. Signals between the discharge control unit DCU and the circuit switch control unit SCU or the combined balance and load control unit BLCU can be sent by wire or wirelessly. The third current influencing means $I_3$ and the discharge control unit DCU form or are comprised of a discharge control circuit 13b. If the switchable high ohmic path 4 bypasses the circuit switch $S_C$ (case b), the discharge control unit DCU can be designed to control a discharge of the two series capacitors $C_1$, $C_2$ when the circuit switch $S_C$ is opened and the high ohmic path 4 is switched off or when a current trough the circuit switch $S_C$ and the high ohmic path 4 is zero (see also FIG. 4).

Figure 8:
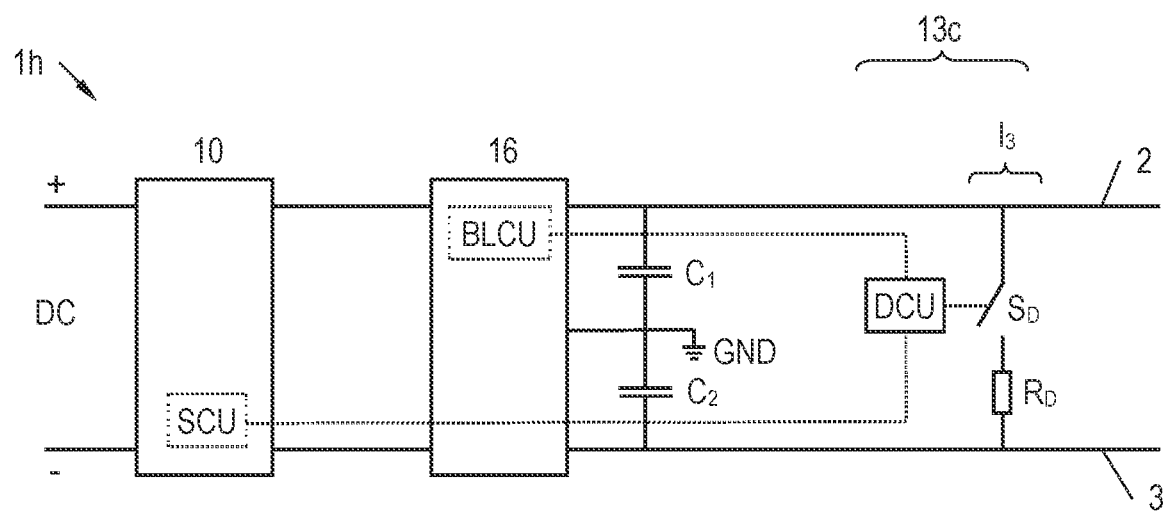
FIG. 8 shows a circuit diagram of an arrangement where the third current influencing means are embodied as a switch and a serial resistor.

FIG. 8 shows an arrangement 1h with an alternative embodiment of third current influencing means $I_3$, which comprise a discharge switch $S_D$ and a discharge resistor $R_D$. A discharge of the two series capacitors $C_1$, $C_2$ is done by closing the discharge switch $S_D$ when at least one of the circuit switches $S_C$, $S_C'$ is opened or when both the high ohmic paths 4a, 4b and the low ohmic paths 5a, 5b are switched off. The third current influencing means $I_3$ and the discharge control unit DCU form or are comprised of a discharge control circuit 13c.

Figure 9:
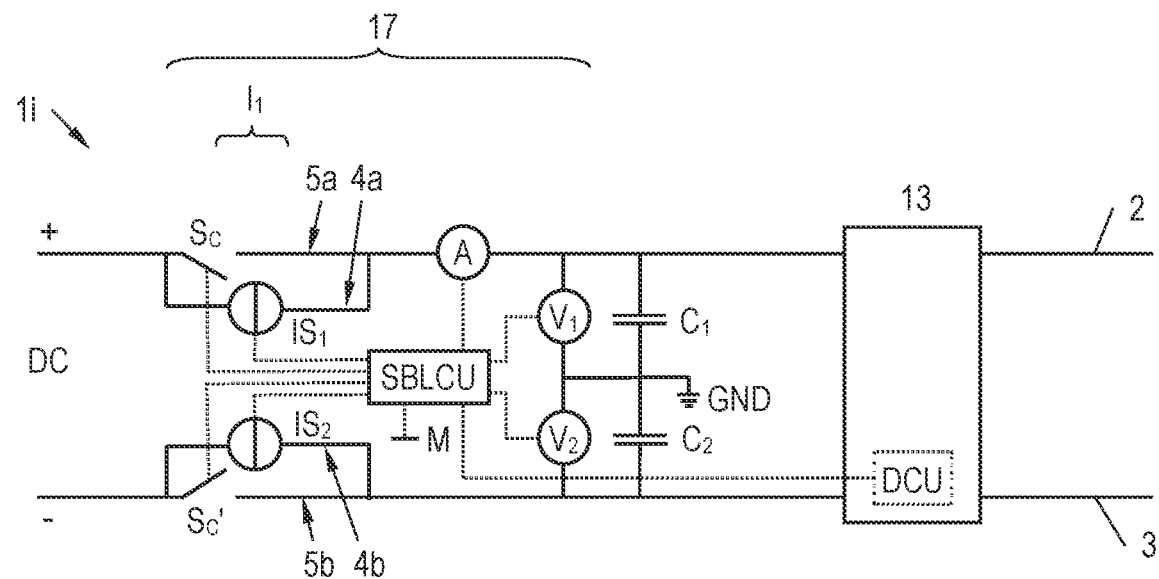
FIG. 9 shows a circuit diagram of an arrangement with a combined circuit switch balance and load control unit.

FIG. 9 shows an arrangement 1i with the first sub current influencing means $IS_1$ and the second sub current influencing means $IS_2$ switched in parallel with a circuit switch $S_C$ and a complementary circuit switch $S_C'$. In detail, the circuit switch $S_C$ is arranged in the first switchable low ohmic path 5a, and the complementary circuit switch $S_C'$ is arranged in the second switchable low ohmic path 5b. The function is similar to the arrangement 1e shown in FIG. 5. However, in contrast the arrangement 1i comprises a combined circuit switch balance and load control unit SBLCU which incorporates the functions of the circuit switch control unit SCU, the balance control unit BCU and load control unit LCU. The combined circuit switch balance and load control unit SBLCU, the voltmeters for measuring the capacitor voltages $V_1$, $V_2$, the circuit switch $S_C$, the complementary circuit switch $S_C'$, the amperemeter A and the first current influencing means $I_1$ form or are comprised of a combined circuit switch balance and load control circuit 17.

Figure 10:
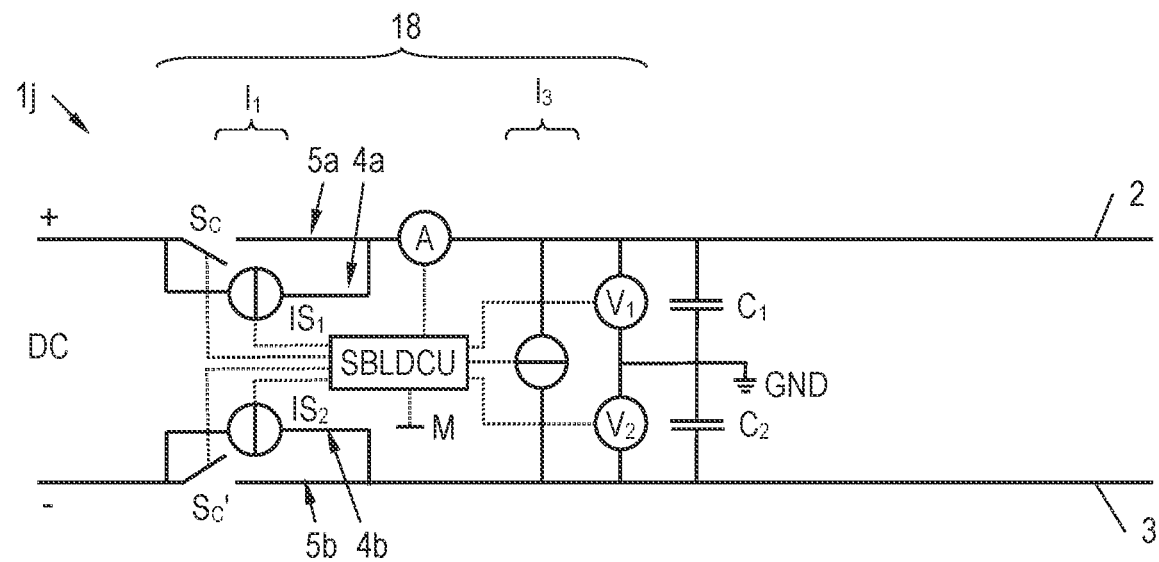
FIG. 10 shows a circuit diagram of an arrangement with a combined circuit switch balance load and discharge control unit.

Moreover, FIG. 10 shows an arrangement 1j with a combined circuit switch balance load and discharge control unit SBLDCU, which incorporates the functions of the combined circuit switch balance and load control unit SBLCU and the discharge control unit DCU. Accordingly, a combined circuit switch balance load and discharge control circuit 18 comprises the elements of the combined circuit switch balance and load control circuit 17 and the third current influencing means $I_3$.

Figure 11:
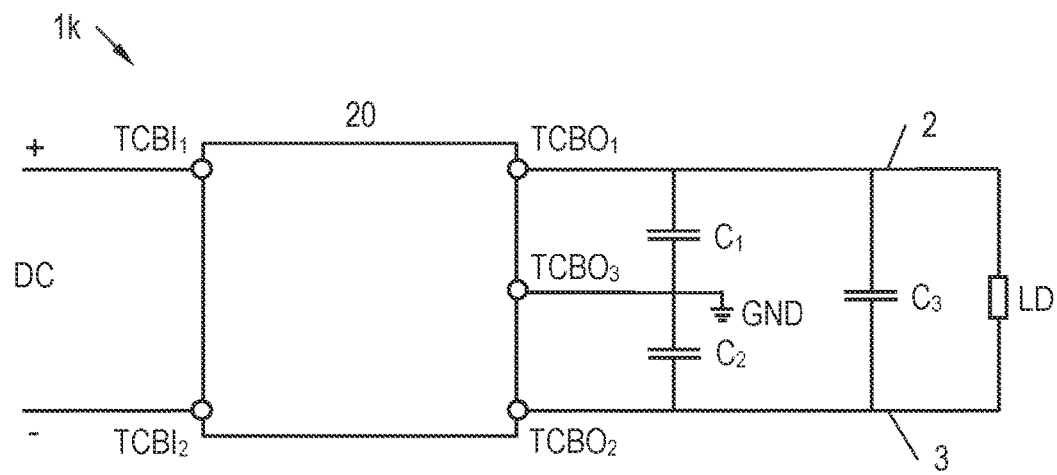
FIG. 11 shows a circuit diagram of an arrangement with a circuit breaker and FIG. 12 shows a circuit diagram of an arrangement with a circuit breaker and a precharging circuit.

FIG. 11 shows an arrangement 1k with a circuit breaker 20. The circuit breaker 20 comprises a first breaker input terminal $TCBI_1$ for connecting the plus pole+ of the direct current power network DC and a second breaker input terminal $TCBI_2$ for connecting a minus pole- of said direct current power network DC. Moreover, the circuit breaker 20 comprises a first breaker output terminal $TCBO_1$ for connecting a first outer tap of two series capacitors $C_1$, $C_2$ and a second breaker output terminal $TCBO_2$ for connecting a second outer tap of the two series capacitors $C_1$, $C_2$. Moreover, the circuit breaker 20 comprises a first breaker current path connecting the first breaker input terminal $TCBI_1$ and the first breaker output terminal $TCBO_1$ and a second breaker current path connecting the second breaker input terminal $TCBI_2$ and the second breaker output terminal $TCBO_2$. In detail, the first breaker current path is part of the first power line 2 and the second breaker current path is part of the second power line 3. Finally, the circuit breaker 20 comprises an optional third breaker output terminal $TCBO_3$ for connecting a middle tap of the two series capacitors $C_1$, $C_2$ or ground GND.

Generally, the circuit breaker 20 may comprise one or more of the functions or circuits of each of the arrangements 1a . . . 1j shown in FIGS. 1 to 10, whenever it includes a circuit switch $S_C$:

Accordingly, the circuit breaker 20 based on FIG. 1 can comprise the switch control circuit 10a and the load control circuit 11a, the switch control circuit 10a and the balance control circuit 12a or the switch control circuit 10a and the load control circuit 11a and the balance control circuit 12a.

The circuit breaker 20 based on FIG. 2 can comprise the switch control circuit 10 (e.g. embodied like the switch control circuit 10a of FIG. 1) and the load control circuit 11b, the switch control circuit 10 and the discharge control circuit 13a, the switch control circuit 10 and the load control circuit 11b and the discharge control circuit 13a, the switch control circuit 10 and the combined balance and discharge control circuit 14a or the switch control circuit 10 and the load control circuit 11b and the combined balance and discharge control circuit 14a.

The circuit breaker 20 based on FIG. 3 can comprise the switch control circuit 10 (e.g. embodied like the switch control circuit 10a of FIG. 1) and the load control circuit 11 (e.g. embodied like the load control circuit 11a of FIG. 1 or the load control circuit 11b of FIG. 2) and the combined balance and discharge control circuit 14b.

The circuit breaker 20 based on FIG. 4 can comprise the combined circuit switch and load control circuit 15 or a combination of the combined circuit switch and load control circuit 15 and the balance control circuit 12 (e.g. embodied like the balance control circuit 12a of FIG. 1).

The circuit breaker 20 based on FIG. 5 can comprise the switch control circuit 10 (e.g. embodied like the switch control circuit 10a of FIG. 1) and the combined balance and load control circuit 16a. In particular the first sub current influencing means $IS_1$ and the second sub current influencing means $IS_2$ each can be embodied as a buck converter like this is depicted in FIG. 6.

The circuit breaker 20 based on FIG. 7 can comprise the switch control circuit 10 (e.g. embodied like the switch control circuit 10a of FIG. 1), a combined balance and load control circuit 16 (e.g. embodied like the combined balance and load control circuit 16a and 16b of FIGS. 5 and 6) and the discharge control circuit 13b. The discharge control circuit 13c can also be embodied as this is shown in FIG. 8).

The circuit breaker 20 based on FIG. 9 can comprise the combined circuit switch balance and load control circuit 17 or a combination of the combined circuit switch balance and load control circuit 17 and the discharge control circuit 13 (e.g. embodied like of the discharge control circuits 13a . . . 13c).

The circuit breaker 20 based on FIG. 10 finally can comprise the combined circuit switch balance load and discharge control circuit 18.

Figure 12:
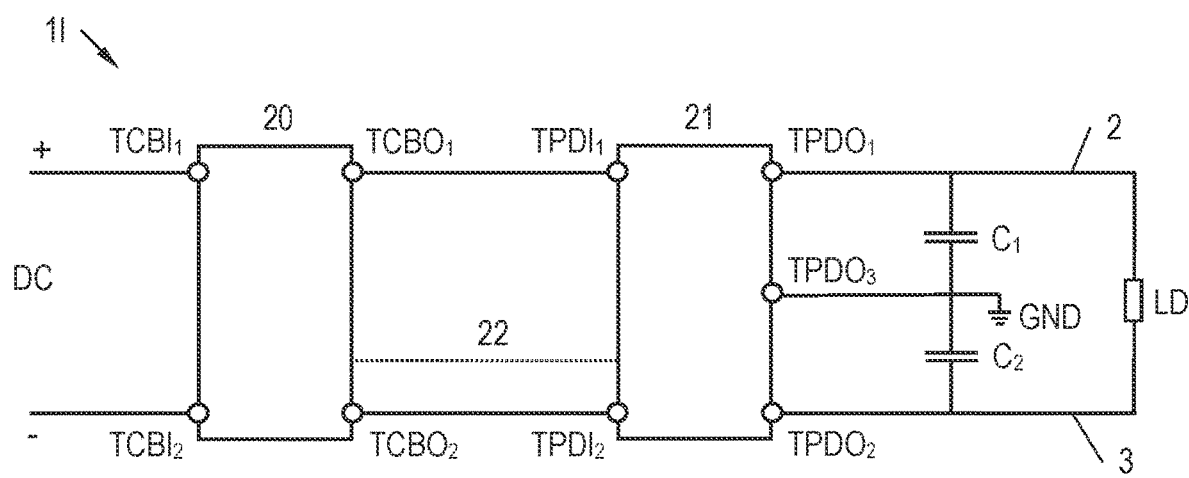

Similar considerations can be made for the precharging device 21, which in FIG. 12 is shown in combination with a circuit breaker 20. The precharging device 21 comprises a first precharger input terminal $TPDI_1$ for connecting the plus pole+ of the direct current power network DC and a second precharger input terminal $TPDI_2$ for connecting a minus pole− of said direct current power network DC. Moreover, the precharging device 21 comprises a first precharger output terminal $TPDO_1$ for connecting a first outer tap of two series capacitors $C_1$, $C_2$ and a second precharger output terminal $TPDO_2$ for connecting a second outer tap of the two series capacitors $C_1$, $C_2$. Moreover, the precharging device 21 comprises a first precharger current path connecting the first precharger input terminal $TPDI_1$ and the first precharger output terminal $TPDO_1$ and a second precharger current path connecting the second precharger input terminal $TPDI_2$ and the second precharger output terminal $TPDO_2$. In detail, the first precharger current path is part of the first power line 2 and the second precharger current path is part of the second power line 3. Finally, the precharging device 21 comprises an optional third precharger output terminal $TPDO_3$ for connecting a middle tap of the two series capacitors $C_1$, $C_2$ or ground GND.

As can be seen in FIG. 12, the capacitors $C_1$, $C_2$ are not necessarily directly connected to the breaker output terminals $TCBO_1$, $TCBO_2$ of the circuit breaker 20 but can also be connected thereto indirectly via the precharging device 21. The same is true for the precharging device 21 because positions of the circuit breaker 20 and the precharging device 21 may change.

Generally, the precharging device 21 may comprise one or more of the functions or circuits of each of the arrangements 1a . . . 1j shown in FIGS. 1 to 10:

Accordingly, the precharging device 21 based on FIG. 1 can comprise the load control circuit 11a, the balance control circuit 12a or a combination of the load control circuit 11a and the balance control circuit 12a.

The precharging device 21 based on FIG. 2 can comprise the load control circuit 11b, the balance control circuit 12a or the discharge control circuit 13a or any combination thereof.

The precharging device 21 based on FIG. 3 can comprise the load control circuit 11 (e.g. embodied like the load control circuit 11a of FIG. 1 or the load control circuit 11b of FIG. 2) or the combined balance and discharge control circuit 14b or a combination thereof.

The precharging device 21 based on FIG. 5 can comprise the combined balance and load control circuit 16a. In particular the first sub current influencing means $IS_1$ and the second sub current influencing means $IS_2$ each can be embodied as a buck converter like this is depicted in FIG. 6.

The precharging device 21 based on FIG. 7 can comprise the combined balance and load control circuit 16 (e.g. embodied like the combined balance and load control circuit 16a and 16b of FIGS. 5 and 6) or the discharge control circuit 13b or a combination thereof. The discharge control circuit 13c can also be embodied as this is shown in FIG. 8).

Based on the considerations above, the functions or circuits of each of the arrangements 1a . . . 1j shown in FIGS. 1 to 10 can be integrated in a circuit breaker 20 or can be split into the circuit breaker 20 and a precharging device 21.

Functions or circuits which are neither part of the circuit breaker 20 nor of the precharging device 21 can be integrated in one or more further devices.

As is depicted in FIG. 12, there can be one or more communication channels 22 between the circuit breaker 20 and the precharging device 21 (or said further devices), which may be embodied as wired or wireless communication channels 22 (see the dotted communication lines in FIGS. 1 to 10).

In all examples there may exist the third capacitance $C_3$ as the case may be and of course also a load LD. Further on, in all examples, the first switches $S_1$, $S_1'$, the second switches $S_2$, $S_2'$, the circuit switches $S_C$, $S_C'$ and/or the discharge switch $S_D$ can be embodied as electronic switches (e.g. transistors) or as electromechanical switches (e.g. relays).

Figure 13:
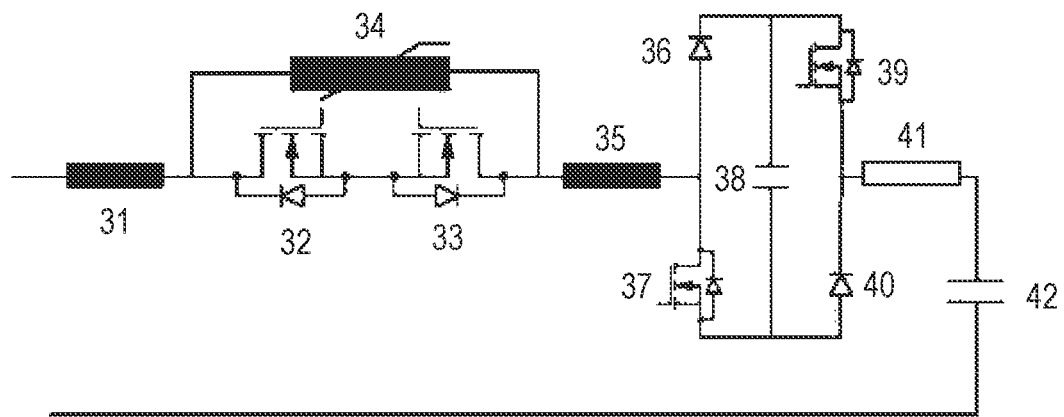
FIG. 13 shows a first example of an solid-state circuit breaker/switch.

FIG. 13 shows a solid-state circuit breaker/switch, comprising two IGBTs (Insulated Gate Bipolar Transistors) 32 and 33 and an overvoltage protection device 34. The inductance 31 represents the line inductance. FIG. 13 shows also a pre-charging unit represented by an Electronic Smoothing Inductance ESI, comprising an inductance 35, a capacitance 38 and an active rectifier with two diodes 36 and 40 and two semiconductor switches 37 and 39. The ESI is an active rectifier and serves as constant current source. The resistor 41 represents the line resistance of the load side. Moreover, the capacitance 42 represents the load capacitance to be charged. The ESI controls the voltage across it (from 35 to 40) and therefore controls the charging current.

Figures 14, 15, 16:
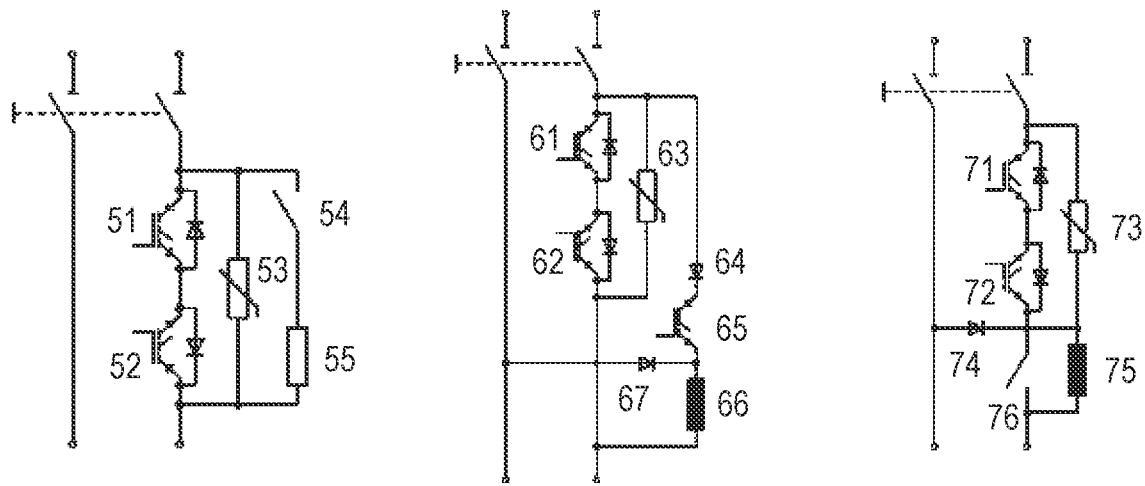
FIG. 14 shows a second example of an solid-state circuit breaker/switch.
FIG. 15 shows a third example of an solid-state circuit breaker/switch.
FIG. 16 shows a fourth example of an solid-state circuit breaker/switch.

FIG. 14 shows a solid-state circuit breaker/switch, comprising two IGBTs 51 and 52 and an overvoltage protection device 53. It also shows a pre-charging unit, comprising an ohmic resistor 55 and a mechanical switch 54 such as a contactor. The pre-charging is started by closing the switch 54 creating a high-ohmic path via the resistor 55 between the bus side and the load side. The capacitor is charged with a small current. To avoid a thermal overload of the resistor 55 due to the charging current, a PTC resistor can be used. It decreases the charging current when heating up. After the capacitor is charged up to the bus voltage, the semiconductor elements 51 and 52 are switched on and the mechanical switch 54 opens.

FIG. 15 shows a solid-state circuit breaker/switch consisting of two IGBTs 61 and 62 and an overvoltage protection device 63. It also shows a pre-charging unit, which is implemented as buck converter, comprising the diodes 64, 67, a transistor 65 (here a MOSFET transistor) and an inductance 66. The basic operation of a buck converter is as follows: First the transistor 65 is switched on, and thus a current flows to the external capacitor (not shown in FIG. 15) charging the same. Since the voltage across the capacitor cannot rise instantly, and since the inductor 66 limits the charging current, the voltage across the capacitor during the switching cycle is not the full bus voltage of the power source. In a second phase, the transistor 65 is switched off. Since the current in an inductor 66 cannot change suddenly, the inductor 66 creates a voltage across it. This voltage is allowed to charge the capacitor and power the load through the diode 67 when the transistor 65 is turned off. The buck converter is controlled in a way that is acts as a constant current source. The circuit breaker switches 61 and 62 (here IGBTs) are inactive (switched off) during the pre-charging. After the capacitor is charged up to the bus voltage, the semiconductor switches 61 and 62 are switched on and the pre-charging switch 65 is switched off.

FIG. 16 shows a solid-state circuit breaker/switch comprising two IGBTs 71 and 72 and an overvoltage protection device 73. It also shows a pre-charging unit, which is implemented as buck converter comprising the diode 74, an inductance 75, a mechanical switch 74 and the IGBT 72. The difference to FIG. 15 is that the buck converter is incorporated in the circuit breaker, meaning that the circuit breaker switch 71 is used as switching element of the buck converter (compare transistor 65 in FIG. 15). The advantage here is, that the already existing switching element 71 is used as circuit breaker switch during normal operation (protection) but serves also as constant current source during pre-charging. The mechanical switch 76 is closed in normal operation (protection) to minimize the power losses (hence bypassing the inductance 75).

Furthermore, it is noted that the invention is not limited to the embodiments disclosed hereinbefore, but combinations of the different variants are possible. In reality, the arrangements 1a . . . 1l, the circuit breaker 20 or the precharging device 21 may have more or less parts than shown in the figures. Moreover, the description may comprise subject matter of further independent inventions.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1a . . . 1l arrangement
2, 3 power line
4, 4a, 4b switchable high ohmic path
5, 5a, 5b switchable low ohmic path
10, 10a circuit switch control circuit/main switch control circuit
11, 11a, 11b load control circuit
12, 12a balance control circuit
13, 13a . . . 13c discharge control circuit
14a, 14b combined balance and discharge control circuit
15 combined circuit switch and load control circuit
16, 16a, 16b combined balance and load control circuit
17 combined circuit switch balance and load control circuit
18 combined circuit switch balance load and discharge control circuit
20 circuit breaker
21 precharging device
22 communication channel
SCU circuit switch control unit
LCU load control unit
BCU balance control unit
DCU discharge control unit
BDCU combined balance and discharge control unit
SLCU combined circuit switch and load control unit
BLCU combined balance and load control unit
SBLCU combined circuit switch balance and load control unit
SBLDCU combined circuit switch balance load and discharge control unit
DC direct current power network
− minus pole
+ plus pole
GND ground
$S_1$, $S_1'$ first switch
$S_2$, $S_2'$ second switch
$S_C$, $S_C'$ circuit switch
$S_D$ discharge switch
$I_1$ . . . $I_3$ current influencing means
$IS_1$, $IS_2$ sub current influencing means
$C_1$ . . . $C_3$ capacitor
$R_L$ load resistor
$R_D$ discharge resistor
A amperemeter
$V_1$, $V_2$ voltage of each of the two series capacitors/voltmeter
$V_T$ total voltage of the two series capacitors/voltmeter
$D_1$, $D_2$ diode
$L_1$, $L_2$ inductance
LD load
M manual push button
$TCBI_1$, $TCBI_2$ breaker input terminal
$TCBO_1$ . . . $TCBO_3$ breaker output terminal
$TPDI_1$, $TPDI_2$ precharger input terminal
$TPDO_1$ . . . $TPDO_3$ precharger output terminal
31, 35, 66, 75 inductance
32, 33, 51, 52, 61, 62, 71, 72 IGBT
34, 53, 63, 73 overvoltage protection device
36, 40, 64, 67, 74 diode
37, 39 semiconductor switch
38, 42 capacitance
54, 76 mechanical switch
41, 55 resistor
65 transistor

What is claimed is:
1. An arrangement, comprising:
a direct current power network with a plus pole and a minus pole;
two series capacitors, a first outer tap being connected to the plus pole via a first power line, a second outer tap being connected to the minus pole via a second power line and a middle tap is connected to ground;
a circuit switch arranged in at least one of the first and the second power line;
a circuit switch control unit configured to open the circuit switch upon overcurrent and/or upon manual intervention;
a switchable high ohmic path in at least one of the first and the second power line, which bypasses a) a switchable low ohmic path in the least one of the first and the second power line or b) the circuit switch;

a load control unit configured to measure a total voltage of the two series capacitors as a measured total voltage and to switch on the high ohmic path and to switch off the low ohmic path in case a) or to switch on the high ohmic path and to switch off the circuit switch in case b) if the measured total voltage is below a first threshold voltage, and to switch on the low ohmic path in case a) or to switch on the circuit switch in case b) if the measured total voltage is equal or above the first threshold voltage or above a higher second threshold voltage, the first threshold voltage and the second threshold voltage being set below a voltage of the direct current power network between the plus pole and minus pole; and a balance control unit configured to measure a capacitor voltage of each of the two series capacitors and detect an imbalance of the capacitor voltages and to individually control currents through the two series capacitors by first current influencing means, a current through a first capacitor of the two series capacitors being higher than a current through a second capacitor of the two series capacitors if the first capacitor voltage of the first capacitor is lower than the second capacitor voltage of the second capacitor and vice versa.

2. The arrangement of claim 1, wherein the circuit breaker is connected to the precharging device by a communication channel between a circuit breaker control interface of the circuit breaker and a precharger control interface of the precharging device, and wherein the communication channel is configured to exchange information about a status of the circuit switch and/or the high ohmic path and/or the low ohmic path.

3. A circuit breaker, comprising:

a first breaker input terminal configured to connect a plus pole of a direct current power network and a second breaker input terminal configured to connect a minus pole of the direct current power network;

a first breaker output terminal configured to connect a first outer tap of two series capacitors and a second breaker output terminal configured to connect a second outer tap of the two series capacitors;

a first breaker current path connecting the first breaker input terminal and the first breaker output terminal and a second breaker current path connecting the second breaker input terminal and the second breaker output terminal;

a circuit switch arranged in at least one of the first and the second breaker current paths;

a circuit switch control unit configured to open the circuit switch upon an overcurrent and/or upon manual intervention;

a switchable high ohmic path in at least one of the first and the second breaker current paths, which bypasses a) a switchable low ohmic path in the least one of the first and the second breaker current paths or b) the circuit switch;

a load control unit configured to measure a total voltage between the first breaker output terminal and the second breaker output terminal as a measured total voltage and to switch on the high ohmic path and to switch off the low ohmic path in case a) or to switch on the high ohmic path and to switch off the circuit switch in case b) if the measured total voltage is below a first threshold voltage, and to switch on the low ohmic path in case a) or to switch on the circuit switch in case b) if the measured total voltage is equal or above the first threshold voltage or above a higher second threshold voltage, the first threshold voltage and the second threshold voltage being set below a nominal voltage applicable to the first breaker input terminal and the second breaker input terminal; and a third breaker output terminal configured to connect a middle tap of the two series capacitors and a balance control unit, which balance control unit is configured to measure a first voltage between the first breaker output terminal and the third breaker output terminal and a second voltage between the third breaker output terminal and the second breaker output terminal, and detect an imbalance of the first and the second voltage and to individually control currents through the first breaker output terminal and the second breaker output terminal, a current through the first breaker output terminal being higher than a current through the second breaker output terminal if the first voltage is lower than the second voltage and vice versa.

4. The circuit breaker of claim 3, further comprising:

first current influencing means comprising first sub current influencing means configured to be switched between the first breaker output terminal and the third breaker output terminal and second sub current influencing means configured to be switched between the third breaker output terminal and the second breaker output terminal.

5. The circuit breaker of claim 4, further comprising:

a discharge control unit configured to control a discharge current between the first breaker output terminal and the second breaker output terminal through a controlled current through the first current influencing means:

in case a) when the circuit switch is opened, when the high ohmic path and the low ohmic path are switched off, when a current trough the circuit switch is zero, or when a current through the high ohmic path and the low ohmic path is zero, and in case b) when the circuit switch is opened and the high ohmic path is switched off or when a current through the circuit switch and the high ohmic path is zero.

6. The circuit breaker of claim 3, further comprising:

first current influencing means comprising first sub current influencing means and second sub current influencing, wherein the first sub current influencing means are arranged in a first switchable high ohmic path in the first breaker current path, which bypasses a) a first switchable low ohmic path in the first breaker current path or b) the circuit switch in the first breaker current path, and wherein the second sub current influencing means are arranged in a second switchable high ohmic path in the second breaker current path, which bypasses a) a second switchable low ohmic path in the second breaker current path in case a) or a complementary circuit switch in the second breaker current path in case b).

7. The circuit breaker of claim 6, further comprising:

a discharge control unit configured to control a discharge current between the first breaker output terminal and the second breaker output terminal through a controlled current through third current influencing means configured to be switched between the first breaker output terminal and the second breaker output terminal:

in case a) when the circuit switch is opened, when the high ohmic path and the low ohmic path are switched off, when a current through the circuit switch is zero, or when a current trough the high ohmic path and the low ohmic path is zero, and in case b) when the circuit switch is opened and the high ohmic path is switched off or when a current through the circuit switch and the high ohmic path is zero.

8. The circuit breaker of claim 3, further comprising:
a circuit breaker control interface configured to be connected to a precharger control interface of the precharging device and to exchange information about a status of the circuit switch and/or the high ohmic path and/or the low ohmic path.

9. A precharging device, comprising:
a first precharger input terminal configured to connect a plus pole of a direct current power network and a second precharger input terminal configured to connect a minus pole of the direct current power network;
a first precharger output terminal configured to connect a first outer tap of two series capacitors and a second precharger output terminal configured to connect a second outer tap of the two series capacitors;
a first precharger current path connecting the first precharger input terminal and the first precharger output terminal and a second precharger current path connecting the second precharger input terminal and the second precharger output terminal;
a switchable high ohmic path in at least one of the first and the second precharger current paths, which bypasses a switchable low ohmic path in the least one of the first and the second precharger current paths;
a load control unit configured to measure a total voltage between the first precharger output terminal and the second precharger output terminal as a measured total voltage and to switch on the high ohmic path and switch off the low ohmic path if the measured total voltage is below a first threshold voltage and to switch on the low ohmic path if the measured total voltage is equal or above the first threshold voltage or above a higher second threshold voltage, the first threshold voltage and the second threshold voltage being set below a nominal voltage applicable to the first precharger input terminal and the second precharger input terminal;
a third precharger output terminal configured to connect a middle tap of the two series capacitors; and
a balance control unit configured to measure a first voltage between the first precharger output terminal and the third precharger output terminal and a second voltage between the third precharger output terminal and the second precharger output terminal, to detect an imbalance of the first and the second voltage, and to individually control currents through the first precharger output terminal and the second precharger output terminal,
wherein a current through the first precharger output terminal is higher than a current through the second precharger output terminal if the first voltage is lower than the second voltage and vice versa.

10. The precharging device of claim 9, further comprising:
first current influencing means comprising first sub current influencing means switched between the first precharger output terminal and the third precharger output terminal and second sub current influencing means switched between the third precharger output terminal and the second precharger output terminal.

11. The precharging device of claim 10, further comprising:
a discharge control unit configured to control a discharge current between first precharger output terminal and the second precharger output terminal through a controlled current through the first current influencing means when the circuit switch is opened, when the high ohmic path and the low ohmic path are switched off, when a current through the circuit switch is zero, or when a current through the high ohmic path and the low ohmic path is zero.

12. The precharging device of claim 9, further comprising:
first current influencing means comprising first sub current influencing means and second sub current influencing means,
wherein the first sub current influencing means are arranged in a first switchable high ohmic path in first precharger current path, which bypasses a first switchable low ohmic path in the first precharger current path, and
wherein the second sub current influencing means are arranged in a second switchable high ohmic path in the second precharger current path, which bypasses a second switchable low ohmic path in the second precharger current path.

13. The precharging device of claim 12, further comprising:
a discharge control unit configured to control a discharge current between the first precharger output terminal and the second precharger output terminal through a controlled current through third current influencing means switched between the first precharger output terminal and the second precharger output terminal when the circuit switch is opened, when the high ohmic path and the low ohmic path are switched off, when a current through the circuit switch is zero, or when a current through the high ohmic path and the low ohmic path is zero.

14. The precharging device of claim 9, further comprising:
a precharger control interface configured to be connected to a circuit breaker control interface of the circuit breaker and to exchange information about a status of the circuit switch and/or the high ohmic path and/or the low ohmic path.

* * * * *